United States Patent [19]

Machida

[11] Patent Number: 5,323,347
[45] Date of Patent: Jun. 21, 1994

[54] SEMICONDUCTOR MEMORY DEVICE STORING TWO TYPES OF BINARY NUMBER DATA AND METHOD OF OPERATING THE SAME

[75] Inventor: Hirohisa Machida, Hyogo, Japan

[73] Assignee: Mitsubishi Denki Kabushiki Kaisha, Tokyo, Japan

[21] Appl. No.: 832,570

[22] Filed: Feb. 7, 1992

[30] Foreign Application Priority Data

Feb. 19, 1991 [JP]  Japan ................................ 3-024732
Jan. 21, 1992 [JP]  Japan ................................ 4-008618

[51] Int. Cl.$^5$ .............................................. G11C 7/00
[52] U.S. Cl. ........................... 365/189.02; 365/189.08; 365/230.02
[58] Field of Search ............... 365/189.08, 190, 231, 365/244, 189.02, 230.02; 395/400, 425

[56] References Cited

U.S. PATENT DOCUMENTS

| | | | |
|---|---|---|---|
| 4,864,528 | 9/1989 | Nishiyama et al. | 364/754 |
| 4,878,192 | 10/1989 | Nishiyama et al. | 364/768 |
| 4,970,690 | 11/1990 | Sherman | 365/189.02 |
| 4,990,915 | 2/1991 | Kondoh et al. | 341/144 |
| 5,150,321 | 9/1992 | Keating | 364/759 |

OTHER PUBLICATIONS

"A VLSI-Oriented High-Speed Multiplier Using a Redundant Binary Addition Tree", by Naofumi Takagi et al, Institute of Electronics and Communication Engineers of Japan, Jun. 1983 vol. J66-D No. 6, pp. 683-690.
"A 200MHz16-bit BiCMOS Signal Processor", Masakazu Yamashina et al, ISSCC 89 Digest of Technical Papers, Feb. 1989, pp. 172-173.
"A 33MFLOPS Floating Point Processor Using Redundant Binary Representation", by Hisakazu Edamatsu, 1988 ISSCC Digest of Technical Papers, Feb. 1988 pp. 152-153.

*Primary Examiner*—Joseph L. Dixon
*Assistant Examiner*—Jack A. Lane
*Attorney, Agent, or Firm*—Lowe, Price, LeBlanc & Becker

[57] ABSTRACT

A semiconductor memory device 1 includes a plurality of memory circuits 10. Each of the memory circuits 10 includes a data bit memory cell 11, a sign bit memory cell 12, a converting circuit 13 and a selecting circuit 14. The data bit memory cell 11 stores one bit of binary number data or a data bit of redundant binary number data. The sign bit memory cell 12 stores a digit of a sign bit of redundant binary number data. The converting circuit 13 converts redundant binary number data into binary number data on the basis of the data bit stored in the data bit memory cell and the sign bit stored in the sign bit memory cell 12. The selecting circuit 14 selects the data bit stored in data bit memory cell 11 or the one bit of binary number data outputted by the converting circuit 13.

24 Claims, 10 Drawing Sheets

FIG. 3

| REDUNDANT BINARY NUMBER | SIGN BIT A | DATA BIT B |
|---|---|---|
| −1 | 1 | 1 |
| 0 | 0 | 0 |
| 0 | 1 | 0 |
| +1 | 0 | 1 |

FIG. 10 PRIOR ART

DECIMAL NUMBER                BINARY NUMBER

DECIMAL NUMBER           REDUNDANT BINARY NUMBER

3            -->        1 , 0 , -1

+)     1            -->     +) 0 , 0 , 1

4            -->        1 , 0 , 0

SEMICONDUCTOR MEMORY DEVICE STORING TWO TYPES OF BINARY NUMBER DATA AND METHOD OF OPERATING THE SAME

BACKGROUND OF THE INVENTION

1. Field of the Invention

The present invention relates to semiconductor memory devices, and more particularly to a semiconductor memory device storing two types of binary number data and an operation method thereof.

2. Description of the Background Art

The recent development in the semiconductor technology is remarkable, which is enabling integration of a large number of circuit elements on a single chip. Also, there exists a great demand for further speeding up the processing speed, and particularly the demand for processing arithmetic operations at high speed is on the increase. As a method of processing arithmetic operations at high speed, use of operating circuits using redundant binary numbers is becoming the object of attention.

General binary numbers in which each digit is expressed using two numbers, that is, 0 and 1, are referred to as binary numbers herein. On the other hand, binary numbers in which each digit is expressed using three numerals, 1, 0 and $-1$ are referred to as redundant binary numbers. A binary number having n bits is generally represented as $x_n x_{n-1} \ldots x_1$. Herein, a binary number by binary representation without a sign is represented as $[x_n x_{n-1} \ldots x_1]_2$, and a binary number by the 2's complement representation is expressed as $[x_n x_{n-1} \ldots x_1]_{c2}$. In this case, each of $x_n, x_{n-1}, \ldots, x_1$ represents 0 or 1. A redundant binary number is expressed as $[x_n, x_{n-1}, \ldots x_1]_{SD2}$. In this case, each of $x_n, x_{n-1}, \ldots, x_1$ represents 1, 0 or $-1$.

In the binary representation, a decimal number "3" is expressed as $[011]_2$. On the other hand, in the redundant binary representation, the decimal number "3" is represented as $[0, 1, 1]_{SD2}$ or $[1, 0, -1]_{SD2}$. Thus, in the redundant binary representation, a numeral can be represented in plural ways.

The mutual conversion between binary numbers and redundant binary numbers is described in "A VLSI-Oriented High-Speed Multiplier Using a Redundant Binary Addition Tree", Papers of the Institute of Electronics and Communication Engineers of Japan, June 1983 Vol. J66-D No. 6, pp. 683-690 by Takagi, Yasuura and Yajima, for example.

A binary representation coincides with one of redundant binary representations. For example, a binary representation $[011]_2$ coincides with a redundant binary representation $[0, 1, 1]_{SD2}$. Accordingly, no processings are required in order to convert a binary number into a redundant binary number.

On the other hand, conversion from a redundant binary number into a binary number can be performed by subtraction of two binary numbers One binary number is obtained by setting bits corresponding to digits of "1" in a redundant binary number to "1" and setting remaining bits to "0". The other binary number is obtained by setting bits corresponding to digits of "$-1$" in a redundant binary number to "1" and setting remaining bits to "0". Subtracting the other binary number from the one binary number, a binary number by the 2's complement representation is obtained.

For example, a redundant binary number $[1, 0, -1]_{SD2}$ is converted into a binary number $[0\ 1\ 1]_{C2}$ as described below.

$$[1, 0, -1]_{SD2} = [100]_2 - [001]_2 = [011]_{C2}$$

Subtraction of two binary numbers is performed by addition using binary numbers by 2's complement representation. Accordingly, conversion from a redundant binary number into a binary number is mainly made using an adder circuit.

In operation using binary numbers, a delay occurs due to propagation of carry signals, so that the operation time increases as the data bit length increases. On the other hand, a single number can be represented in plural ways in the redundant binary number representation, so that the number of times of carrying can be reduced. Addition and multiplication using redundant binary numbers are described in the above-identified Papers of the Institute of Electronics and Communication Engineers of Japan.

An example of simple addition is now described. When performing an addition $3+1=4$ using binary numbers, as shown in FIG. 10, a carry is generated from the least significant bit to the second bit and further a carry is generated from the second bit to the third bit. On the other hand, as shown in FIG. 11, a decimal number "3" is expressed as a redundant binary number $[1, 0, -1]_{SD2}$ and a decimal number "1" is expressed as a redundant binary number $[0, 0, 1]_{SD2}$. In such addition as using redundant binary numbers, a carry is not generated. Accordingly, use of redundant binary numbers enables high speed operation.

A large number of circuit elements are required in an operation circuit using redundant binary numbers, but it does not a matter because of the recent development in the semiconductor technique. Accordingly, an operation circuit using redundant binary numbers and having high speed performance are incorporated in a semiconductor integrated circuit device. An operation circuit using redundant binary numbers is disclosed in Yamashita et al., "A 200 MHz 16-bit BiCMOS Signal Processor", 1989 ISSCC DIGEST OF TECHNICAL PAPERS., pp. 172-173 and Edamatsu et al., "A 33MFLOPS Floating Point Processor Using Redundant Binary Representation", 1988 ISSCC DIGEST OF TECHNICAL PAPERS, pp. 152-153, for example.

As described above, high speed operation circuits using redundant binary numbers are in development. However, in most data processing systems, binary number data are employed. Accordingly, mutual conversion is required between a redundant binary number and a binary number for connecting an operation circuit using redundant binary numbers to other systems. Accordingly, a binary number adder circuit is necessary as described and the operation time increases because of the conversion.

Especially, in normal microprocessors, arithmetic operation processes and logic operation processes are performed related to a large amount of data. The arithmetic operation processes can be performed using redundant binary number data but the logical operation processes cannot be performed using redundant binary number data.

In FIG. 12, a general microprocessor, mainly its execution unit, is shown. A microprocessor 300 includes a register file circuit (RF) 310 and an operation process circuit (Arithmetic Logic Unit ALU) 320. A main memory device 200 is connected to the microprocessor 300. Microprocessor 300 is formed of a single LSI and main memory device 200 is formed of another LSI. Binary number data is stored in main memory device 200. Operation processing circuit 320 performs operation processes such as arithmetic operation processes, logical operation processes and so forth. Register file circuit 310 is formed of a normal RAM (Random Access Memory) which stores data necessary in processings by operation processing circuit 320 in the data stored in main memory device 200.

Now, assuming that an operation circuit is used which is capable of operation utilizing redundant binary numbers and mutual conversion between a redundant binary number and a binary number, the operation in that case is described.

First, binary number data required for operation processing by operation processing circuit 320 is transferred from main storage 200 to register file circuit 310, where the data is stored. When executing an instruction of adding two numbers, for example, two pieces of binary number data are transferred from main storage 200 to register file circuit 310.

Next, operation processing circuit 320 executes a process of adding the two pieces of data. Since binary number data can be regarded as redundant binary number data, operation processing circuit 320 executes operation utilizing redundant binary numbers in this case. The operation time is thus reduced A result of the operation is redundant binary number data.

Usually register file circuit 310 cannot store redundant binary number data. Accordingly, operation processing circuit 320 converts redundant binary number data into binary number data. The converted binary number data is stored in register file circuit 310. In this case, operation processing circuit 320 is required to perform a conversion process in addition to the operation process, so that a long execution time is required after all.

If it is assumed that register file circuit 310 can store redundant binary number data, the operation result is stored in register file circuit 310 in the form of a redundant binary number. If an instruction utilizing the operation result next is an instruction of arithmetic operation, the operation can be executed utilizing the redundant binary number data.

If an instruction utilizing the operation result next is an instruction of logical operation, however, the redundant binary number data must be converted into binary number data. In that case, operation processing circuit 320 must perform the conversion processing, resulting in an increase in the execution time.

Furthermore, even if no instructions of logical operation exist, the redundant binary number data stored in register file circuit 310 is reserved in main memory device 200 finally. Main memory device 200 is also connected to other circuits in the system, so that data must be necessarily stored in the form of binary numbers. Accordingly, redundant binary number data stored in register file circuit 310 is transferred to main memory device 200 after converted into binary number data by operation processing circuit 320.

Thus, extra time is taken for converting redundant binary number data into binary number data, resulting in low execution speed. Accordingly, it is not done actually to incorporate an operation circuit utilizing redundant binary number data into a microprocessor.

However, great demands exist for further speeding up microprocessors by performing arithmetic operations with redundant binary numbers.

SUMMARY OF THE INVENTION

It is an object of the present invention to prevent an increase in execution time due to conversion from redundant binary number data into binary number data to enable operation processings at high speed.

It is another object of the present invention to provide a semiconductor memory device capable of storing given data in both forms of a binary number and a redundant binary number and an operation method thereof.

It is still another object of the present invention to provide a semiconductor integrated circuit device capable of operation processings at high speed without an increase in execution time due to conversion from redundant binary number data into binary number data.

A semiconductor memory device according to the present invention includes at least one storing circuit, a writing circuit and a reading circuit. The storing circuit includes a memory cell storing redundant binary number data, a converting circuit for converting the redundant binary number data stored in the memory cell into binary number data, and a selecting circuit for selecting either one of the redundant binary number data stored in the memory cell and the binary number data converted by the converting circuit. The writing circuit writes the binary number data or the redundant binary number data into the memory cell of the storing circuit. The reading circuit reads the data selected by the selecting circuit of the storing circuit.

In the semiconductor memory device, when redundant binary number data is written in the memory cell of the storing circuit by the writing circuit, the redundant binary number data is converted into binary number data by the converting circuit. When the redundant binary number data is required, the redundant binary number data stored in the memory cell is selected by the selecting circuit, and the selected binary number data is read by the reading circuit. When binary number data is required, the binary number data converted by the converting circuit is selected by the selecting circuit, and the selected binary number data is read by the reading circuit.

When binary number data is written into the memory cell of the storing circuit by the writing circuit, the binary number data can be regarded as redundant binary number data as it is. In this case, the data stored in the memory cell and the data converted by the converting circuit have the same form.

As described above, in both cases where either one of redundant binary number data and binary number data is written in a storing circuit, the data can be read in the form of redundant binary number data and also it can be read in the form of binary number data, as required.

A semiconductor memory device according to another aspect of the present invention includes at least one storing circuit, a converting circuit, a writing circuit and a reading circuit. The storing circuit includes a first memory cell storing binary number data and a second memory cell storing redundant binary number data. The converting circuit converts externally given redundant binary number data into binary number data. The writing circuit writes the externally applied redundant binary number data and the binary number data converted by the converting circuit into the first and second memory cells of the storing circuit, respectively. The reading circuit selectively reads the binary number data stored in the first memory cell of the storing circuit and the redundant binary number data stored in the second memory cell of the storing circuit.

In the semiconductor memory device, when redundant binary member data is externally applied, the redundant binary number data is converted into binary number data by the converting circuit. The converted binary number data is written by the writing circuit into the first memory cell of the storing circuit, and the redundant binary number data is written into the second memory cell of the storing circuit by the writing circuit. When binary number data is required, the binary number data stored in the first memory cell of the storing circuit is read by the reading circuit. When redundant binary number data is required, the redundant binary number data stored in the second memory cell of the storing circuit is read by the reading circuit.

When binary number data is externally applied, the binary number data can be regarded as redundant binary number data as it is. In this case, the data stored in the first memory cell of the storing circuit and the data stored in the second memory cell of the storing circuit have the same form.

As described above, even if either of redundant binary data and binary number data is applied externally, that data is stored in the storing circuit in both forms of redundant binary number data and binary number data. Accordingly, the data can be read in the form of redundant binary number data, and the data is also read in the form of binary number data, as needed.

When writing data, the data is stored in both forms of a binary number and a redundant binary number, so that data in the required form can be immediately read out when reading data. Accordingly, there is no need of performing the process of mutual conversion between binary number data and redundant binary number data in other circuits utilizing that data. As a result, using the semiconductor memory devices according to the present invention, semiconductor integrated circuit devices capable of high speed processings can be obtained.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a diagram showing one example of a representation method of redundant binary number data.

FIG. 10 is a diagram showing one example of addition using binary numbers.

FIG. 11 is a diagram showing one example of addition using redundant binary numbers.

DESCRIPTION OF THE PREFERRED EMBODIMENTS

Figure 1:
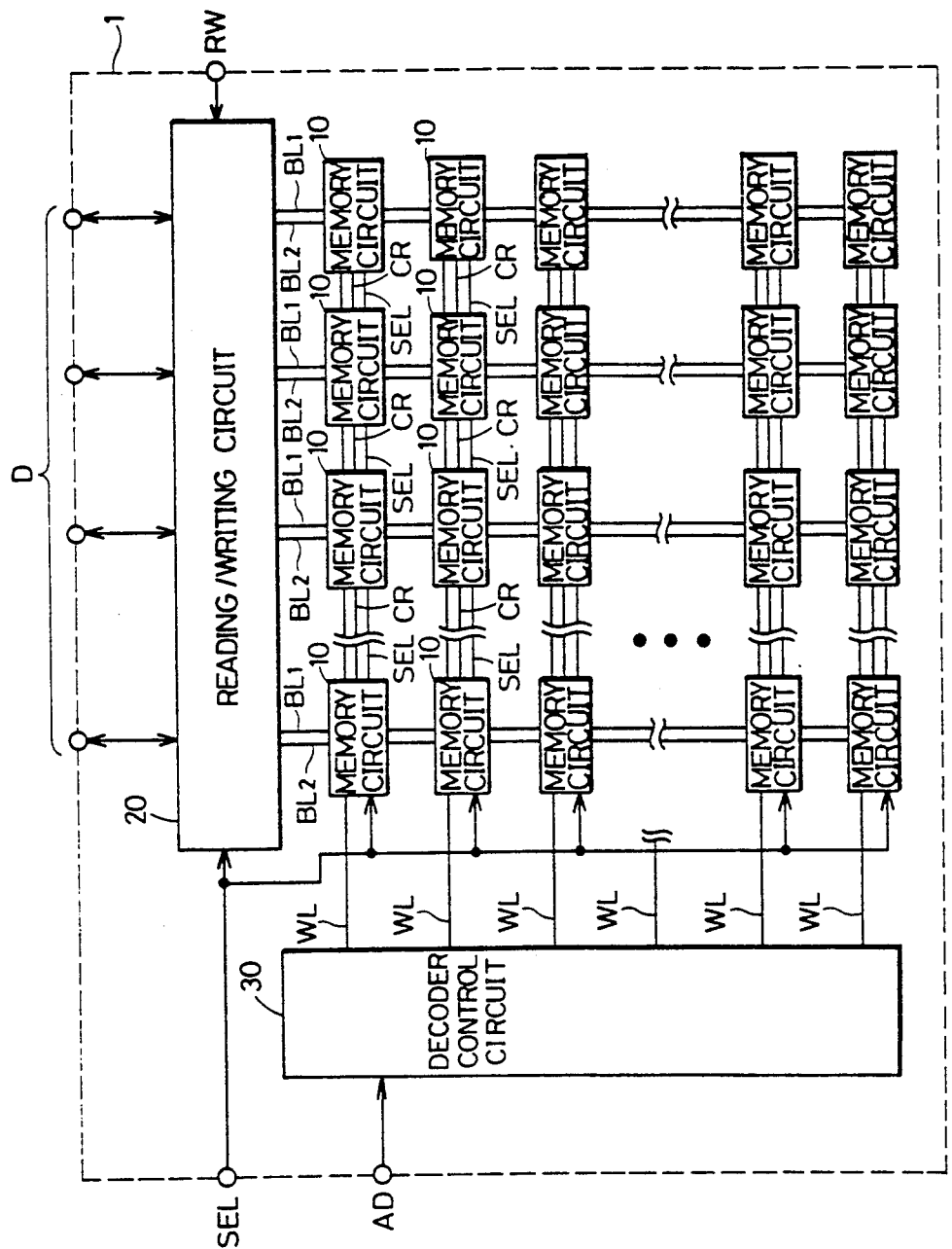
FIG. 1 is a block diagram illustrating configuration of a semiconductor memory device according to one embodiment of the present invention.

In FIG. 1, a semiconductor memory device 1 includes a plurality of memory circuits 10 arranged in a plurality of rows and columns, reading/writing circuit 20 and a decoder-control circuit 30. First and second bit lines BL1 and BL2 are provided corresponding to respective columns of memory circuits 10, and word lines WL are provided corresponding to respective rows of memory circuits 10. The first and second bit lines BL1, BL2 are connected to reading/writing circuit 20. Each word line WL is connected to decoder-control circuit 30. The number of columns of memory circuits 10 corresponds to the number of bits of stored data D. Accordingly, when the number of columns of memory circuits 10 is n, n-bits of data are stored in each row of memory circuits 10.

Each memory circuit 10 is connected to corresponding word line WL and corresponding first and second bit lines BL1, BL2. A carry signal CR outputted from each memory circuit 10 of each row is applied to memory circuit 10 for a higher order bit.

Binary number data D or redundant binary number data D is externally provided to reading/writing circuit 20. Binary number data D or redundant binary number data D is outputted out of semiconductor memory device 1 from reading/writing circuit 20. A selection signal SEL and a reading/writing signal RW are externally applied to reading/writing circuit 20. The selection signal SEL is also applied to all the memory circuits 10. An address signal AD is externally applied to decoder-control circuit 30.

Figure 2:
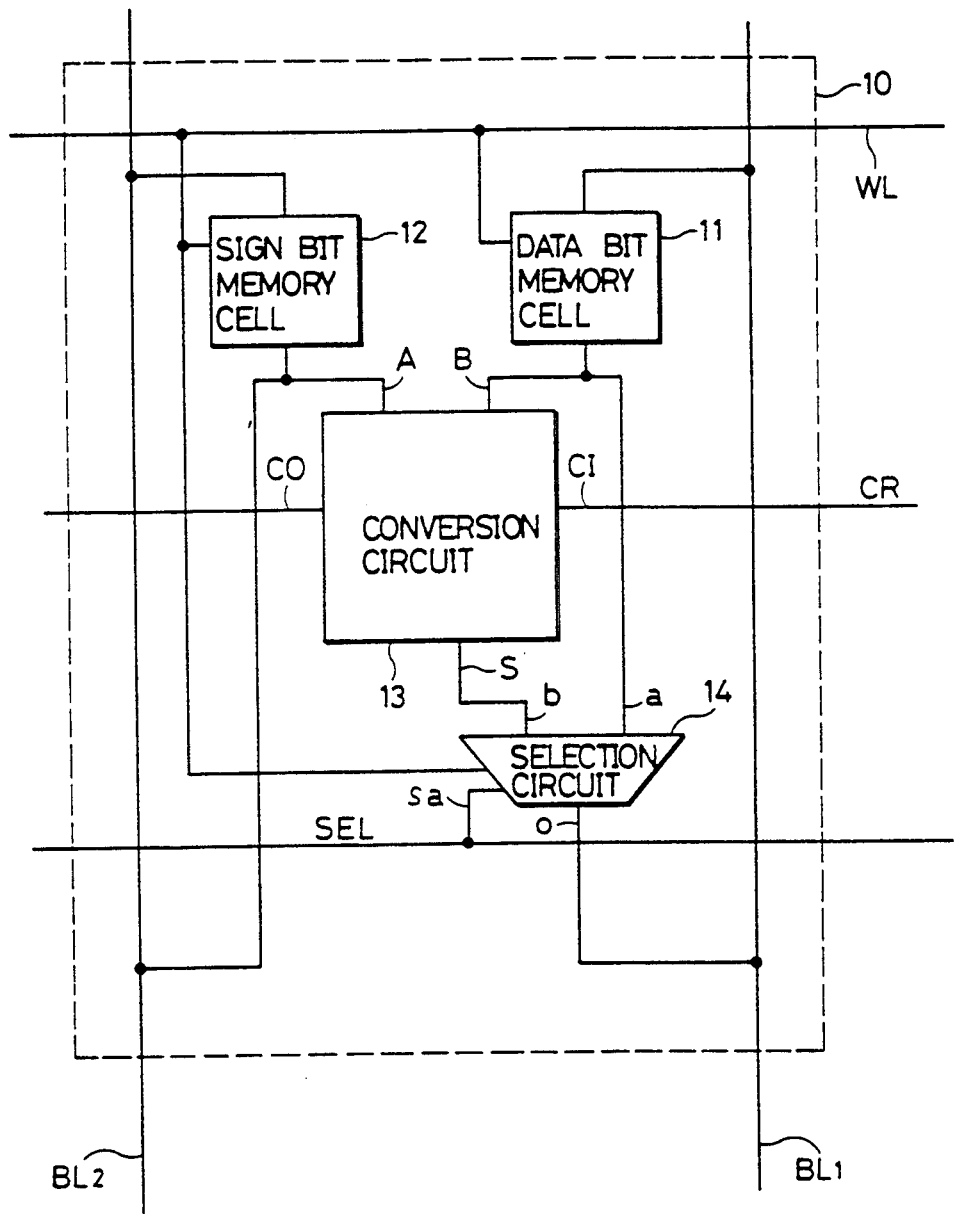
FIG. 2 is a block diagram indicating configuration of a memory circuit included in the semiconductor memory device of the embodiment.

Configuration of each memory circuit 10 is shown in FIG. 2. Memory circuit 10 includes a data bit memory cell 11, a sign bit memory cell 12, a conversion circuit 13 and a selection circuit 14. Each of data bit memory cell 11 and sign bit memory cell 12 stores data of 1 bit.

An input terminal of data bit memory cell 11 is connected to a corresponding first bit line BL1. A control terminal of data bit memory cell 11 is connected to corresponding word line WL. An input terminal of sign bit memory cell 12 is connected to corresponding second bit line BL2. A control terminal of sign bit memory cell 12 is connected to corresponding word line WL. An output terminal of data bit memory cell 11 is connected to one input terminal of conversion circuit 13 and one input terminal of selection circuit 14. An output terminal of sign bit memory cell 12 is connected to the other input terminal of conversion circuit 13 and a corresponding second bit line BL2.

An output terminal of conversion circuit 13 is connected to the other input terminal of selection circuit 14. A control terminal of selection circuit 14 is connected to corresponding word line WL. An output terminal of selection circuit 14 is connected to a corresponding first bit line BL1. A selection signal SEL is applied to selection circuit 14. Conversion circuit 13 receives a carry signal CR from a conversion circuit in a memory circuit corresponding to a lower order bit and applies a carry signal CR to a conversion circuit in a memory circuit corresponding to a higher order bit.

Redundant binary number data is formed of a sign bit and a data bit as shown in FIG. 3. A redundant binary number "−1" is represented with a sign bit "1" and a data bit "1". A redundant binary number "1" is represented with a sign bit "0" and a data bit "1". A redundant binary number "0" is represented with a data bit "0". In this case, if the data bit is "0", without any connection with a value of a sign bit, that bit is recognized as a redundant binary number "0".

Each bit of binary number data is applied to a first bit line BL1. A data bit at each digit of redundant binary number data is applied to first bit line BL1 and a sign bit of each digit of redundant binary number data is applied to a second bit line BL2. Data bit memory cell 11 stores a data bit at each bit of binary number data or a data bit at each digit of redundant binary number data. Sign bit memory cell 12 stores a sign bit at each digit of redundant binary number data. When each bit of binary number data is applied to data bit memory cell 11, "0" is applied to sign bit memory cell 12.

Conversion circuit 13 mainly includes a full adder, and automatically converts redundant binary number data into binary number data on the basis of a carry signal CR, a data bit and a sign bit without an external instruction. A plurality of conversion circuits 13 corresponding to a single row shown in FIG. 1 convert redundant binary number data of n digits into binary number data in the above described method. That is, n conversion circuits 13 corresponding to a single row produce two kinds of binary number data from given redundant binary number data and perform addition of these pieces of binary number data with a full adder to convert the given redundant binary number data into binary number data.

Figure 4:
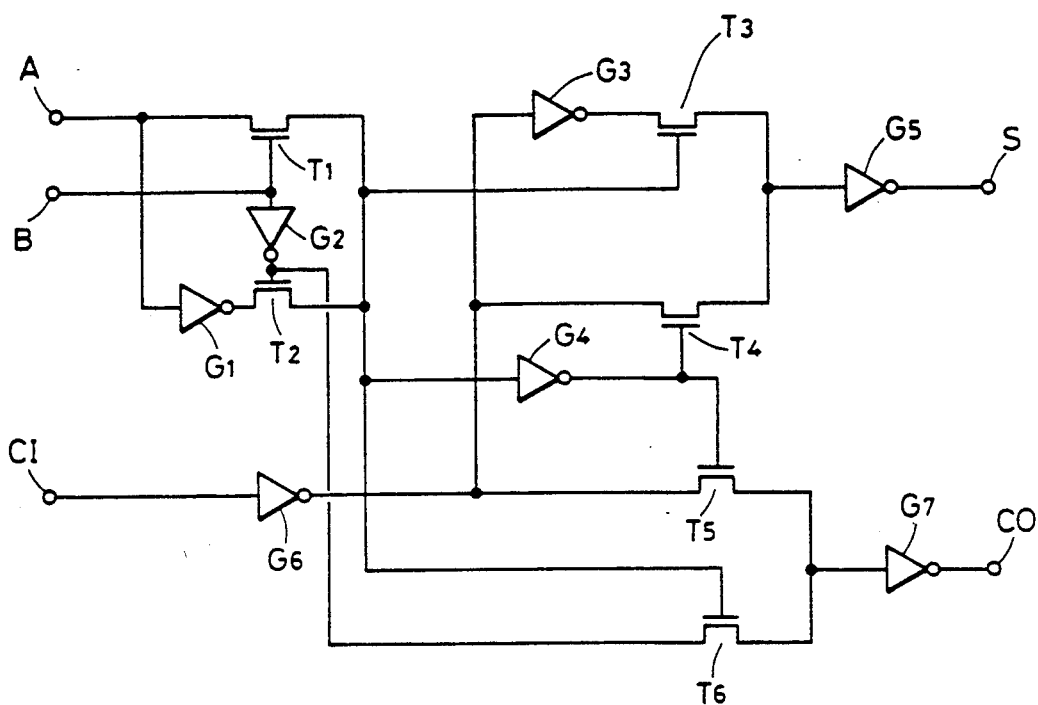
FIG. 4 is a circuit diagram indicating configuration of a conversion circuit.

Detailed configuration of conversion circuit 13 is shown in FIG. 4.

Conversion circuit 13 includes N channel MOS transistors T1–T6 and inverters G1–G7. An input terminal A receives a sign bit from a sign bit memory cell 12 and an input terminal B receives a data bit from a data bit memory cell 11. A carry input terminal CI receives a carry signal CR from a conversion circuit inside a memory circuit corresponding to a lower order bit. The result of conversion is outputted from an output terminal S. A carry signal CR to be applied to a conversion circuit inside a memory circuit corresponding to a higher order bit is outputted from a carry output terminal CO.

When a data bit provided to input terminal B is "1", transistor T1 turns on. When a sign bit applied to input terminal A is "1", transistors T3, T6 turn on. An inverted signal of the carry signal CR applied to carry input terminal CI is thus outputted from output terminal S. A data bit "1" applied to input terminal B is outputted from carry output terminal CO. When a sign bit applied to input terminal A is "0", transistors T4 and T5 turn on. A carry signal CR applied to carry input terminal CI is thus outputted from output terminal S. A carry signal CR applied to carry input terminal CI is outputted from carry output terminal CO, too.

When a data bit applied to input terminal B is "0", transistor T2 turns on. When a sign bit applied to input terminal A is "1", transistors T4 and T5 turn on. A carry signal CR applied to carry input terminal CI is thus outputted from output terminal S. A carry signal CR applied to carry input terminal CI is outputted from carry output terminal CO, too. When a sign bit applied to input terminal A is "0", transistors T3 and T6 turn on. An inverted signal of the carry signal CR applied to carry input terminal CI is thus outputted from output terminal S. A data bit "0" applied to input terminal B is outputted from carry output terminal CO.

Next, referring to FIGS. 1 and 2, operation of semiconductor memory device 1 of the present embodiment will be described.

Data reading operation or writing operation is selected with reading/writing signal RW. When writing redundant binary number data, redundant binary number data D of n-bits is externally inputted into reading/writing circuit 20. Reading/writing circuit 20 applies data bits at respective digits of the redundant binary number data to first bit lines BL1 and sign bits at respective digits of the redundant binary number data to second bit lines BL2.

Decoder-control circuit 30 selects one of the plurality of word lines WL in response to an address signal AD externally applied. Thus, n memory circuits 10 connected to the selected word line WL are selected. As a result, data bit memory cell 11 and sign bit memory cell 12 in each of the selected memory circuits 10 attain the active state (refer to FIG. 2). Thus, a data bit on a corresponding first bit line BL1 is written into data bit memory cell 11 and the data bit is outputted from the data bit memory cell 11. A sign bit on a corresponding second bit line BL2 is written into sign bit memory cell 12 and also the sign bit is outputted from the sign bit memory cell 12.

Conversion circuits 13 corresponding to the selected one row convert redundant binary number data into binary number data on the basis of data bits and sign bits. Each of conversion circuits 13 reserves corresponding bit of the converted binary number data and also outputs it to selection circuit 14.

As described above, redundant binary number data is stored in data bit memory cells 11 and sign bit memory cells 12 in memory circuits 10 of the selected one row, and binary number data is stored in conversion circuits 13 in memory circuits 10 of the selected row.

When writing binary number data, the same operation is performed. In this case, a single bit of binary number data is written in data bit memory cell 11 of each memory circuit 10 and "0" is written in sign bit memory cell 12. Since binary number data can be regarded as redundant binary number data as it is, special processes and conversion time are not required for conversion from binary number data into redundant binary number data.

When reading data, reading operation is selected with a reading/writing signal. Decoder-control circuit 30 selects one of a plurality of word lines WL in response to an address signal AD externally applied. Thus, n memory circuits 10 connected to the selected word line WL is selected. As a result, data bit memory cell 11, sign bit memory cell 12 and selection circuit 14 in the selected each memory circuit 10 attain the active state. Binary number data or redundant binary number data is selected with a selection signal SEL externally applied.

When reading binary number data, selection circuit 14 applies an output of conversion circuit 13 to corresponding first bit line BL1. As a result, binary number data is read on a plurality of first bit lines BL1. Reading/writing circuit 20 provides as an output the binary number data on the plurality of first bit lines BL1 out of semiconductor memory device 1.

When reading redundant binary number data, selection circuit 14 applies an output of data bit memory cell 11 to corresponding first bit line BL1. Also, an output of sign bit memory cell 12 is applied to corresponding second bit line BL2. As a result, redundant binary number data is read on a plurality of first and second bit lines BL1, BL2. Reading/writing circuit 20 provides as an output the redundant binary number data on the plurality of first and second bit lines BL1, BL2, out of semiconductor memory device 1.

As described above, in the semiconductor memory device of the embodiment, even if any one of binary number data and redundant binary number data is externally applied, that data is stored in the forms of binary number data and the redundant binary number data. Accordingly, the stored data can be read out in the form of binary data and also can be read out in the form of redundant binary number data, as required.

Figure 6:
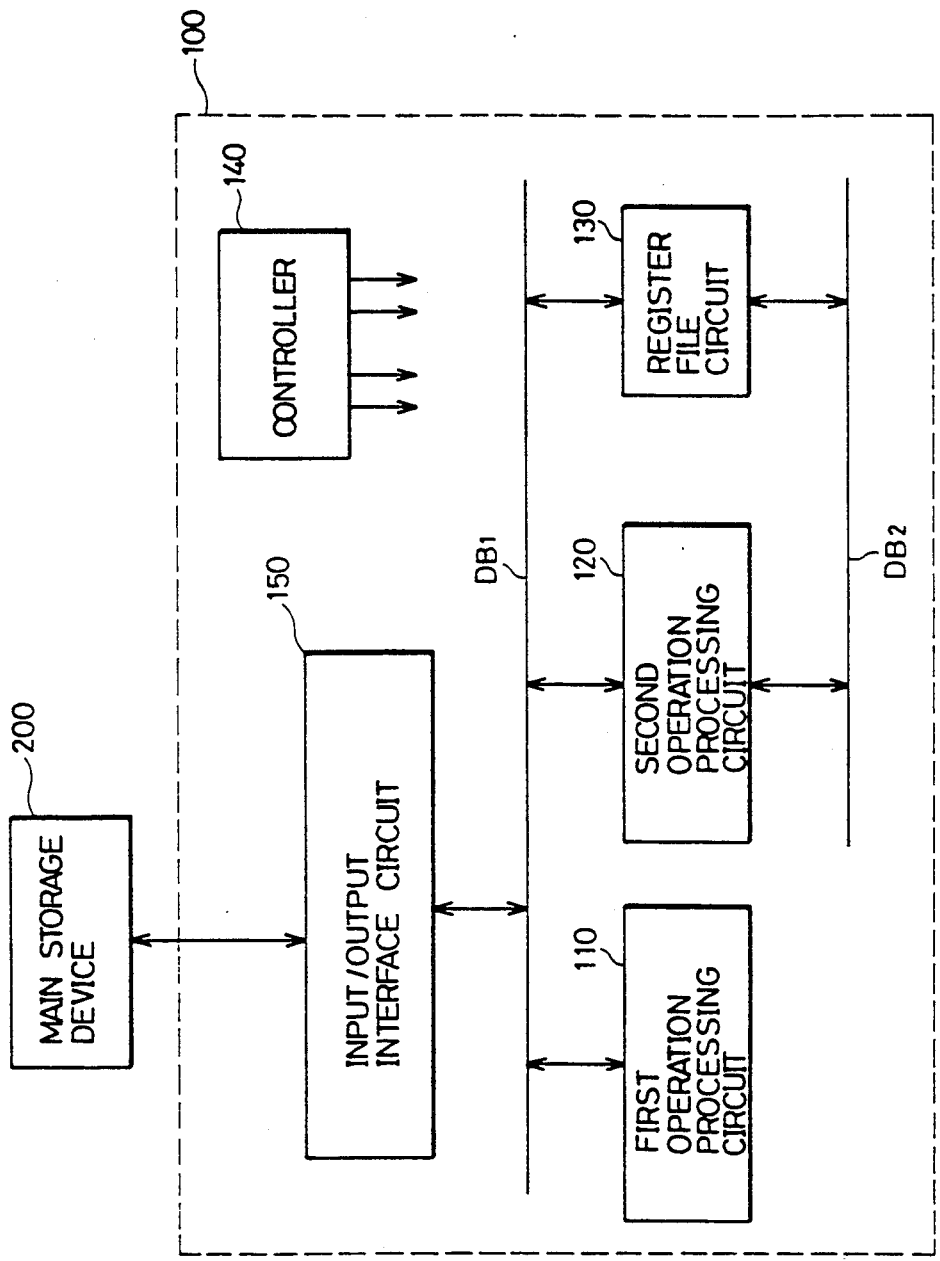
FIG. 6 is a block diagram showing configuration of a microprocessor utilizing the semiconductor memory device of the embodiment.

FIG. 6 is a block diagram showing configuration of a microprocessor employing the semiconductor memory device according to the above-mentioned embodiment. A microprocessor 100 includes a first operation processing circuit 110, a second operation processing circuit 120, a register file circuit 130, a controller 140 and an input/output interface circuit 150. First operation processing circuit 110, second operation processing circuit 120, register file circuit 130 and input/output interface 150 are connected to a first data bus DB1. Second operation processing circuit 120 and register file circuit 130 are also connected to a second data bus DB2. First data bus DB1 is a data bus for binary number data and second data bus DB2 is a data bus for redundant binary number data. Main memory device 200 is connected to input/output interface circuit 150.

First operation processing circuit 110 executes logic operations using binary number data. Second operation processing circuit 120 executes arithmetic operations using redundant binary number data. The semiconductor memory device 1 according to the above-described embodiment is employed as register file circuit 130. Controller 140 controls operation of each circuit of the microprocessor 100. Input/output interface circuit 150 performs interface control among the circuits inside the microprocessor 100 and external devices.

Figure 5:
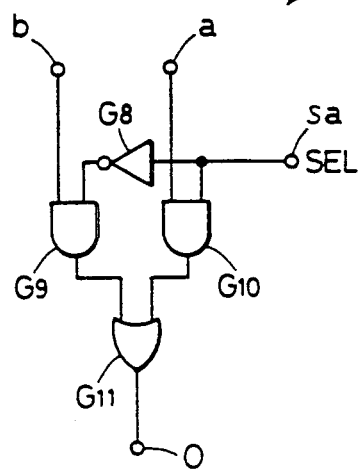
FIG. 5 is a circuit diagram indicating configuration of a selection circuit.

The configuration of selection circuit 14 is shown in FIG. 5. Selection circuit 14 includes an inverter G8, AND gates G9 and G10 and an OR gate G11. An input terminal a receives an output of a data bit memory cell 11 and an input terminal b receives an output of conversion circuit 13. A select terminal sa receives a selection signal SEL. An output terminal o is connected to bit line BL1. In FIG. 5, a control terminal is not shown.

When selection signal SEL is "1", a signal applied to input terminal a is outputted from output terminal o. When selection signal SEL is "0", a signal applied to input terminal b is outputted from output terminal o.

Next, operation of microprocessor 100 of FIG. 6 will be described. Necessary binary number data in binary number data stored in main memory device 200 is taken in input/output interface circuit 150 with an instruction of controller 140. The binary number data is transferred to register file circuit 130 through first data bus DB1 with control by controller 140. Data is stored in register file circuit 130 in the form of binary number data and in the form of redundant binary number data.

When executing a logical operation, required binary number data is transferred from register file circuit 130 to first operation processing circuit 110 through first data bus DB1. Binary number data outputted as operation result from first operation processing circuit 110 is transferred to register file circuit 130 through first data bus DB1.

When executing an arithmetic operation, required redundant binary number data is transferred from register file circuit 130 to second operation processing circuit 120 through second data bus DB2. The redundant binary number data outputted as operation result from second operation processing circuit 120 is transferred to register file circuit 130 through second data bus DB2. Register file circuit 130 converts the redundant binary number data into binary number data and stores those pieces of redundant binary number data and binary number data.

The binary number data stored in register file circuit 130 is transferred to external main memory device 200 through first data bus DB1 and input/output interface circuit 150, as required. The above transfer control is made by controller 140.

Since binary number data can be regarded as redundant binary number data, second operation processing circuit 120 also can directly receive binary number data from main memory device 200 through input/output interface circuit 150 and first data bus DB1 to execute arithmetic operation using the binary number data.

In microprocessor 100 of FIG. 6, first and second operation processing circuits 110 and 120 do not perform mutual conversion between binary number data and redundant binary number data and second operation processing circuit 120 executes arithmetic operation using redundant binary number data, which enhances the execution speed.

Figure 7:
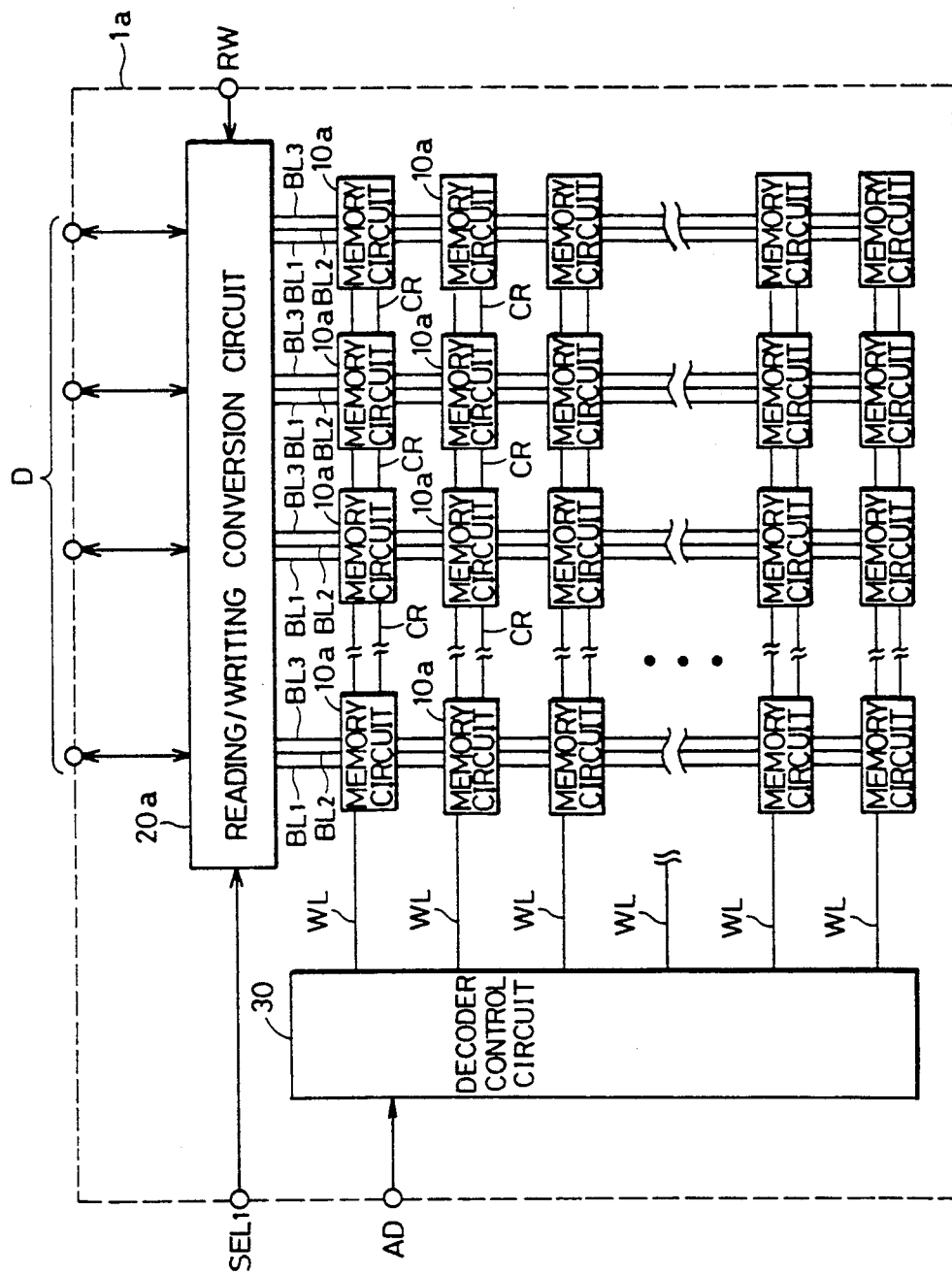
FIG. 7 is a block diagram showing a structure of a semiconductor memory device according to another embodiment of the present invention.

FIG. 7 is a block diagram showing configuration of a semiconductor memory device according to another embodiment of the present invention.

A semiconductor memory device 1a in FIG. 7 includes a plurality of memory circuits 10a arranged in a plurality of rows and a plurality of columns, reading/writing-conversion circuit 20a and a decoder-control circuit 30. First, second and third bit lines BL1, BL2, BL3 are provided corresponding to each column of memory circuits 10a, respectively. Word lines BL are provided corresponding to respective rows of memory circuits 10a.

First, second and third bit lines BL1, BL2, BL3 for the respective columns are connected to reading/writing-conversion circuit 20a. A word line WL for each row is connected to decoder-control circuit 30. A selection signal SEL1 and a reading/writing signal RW are externally applied to reading/writing-conversion circuit 20a. An address signal AD is externally applied to decoder-control circuit 30.

Figure 8:
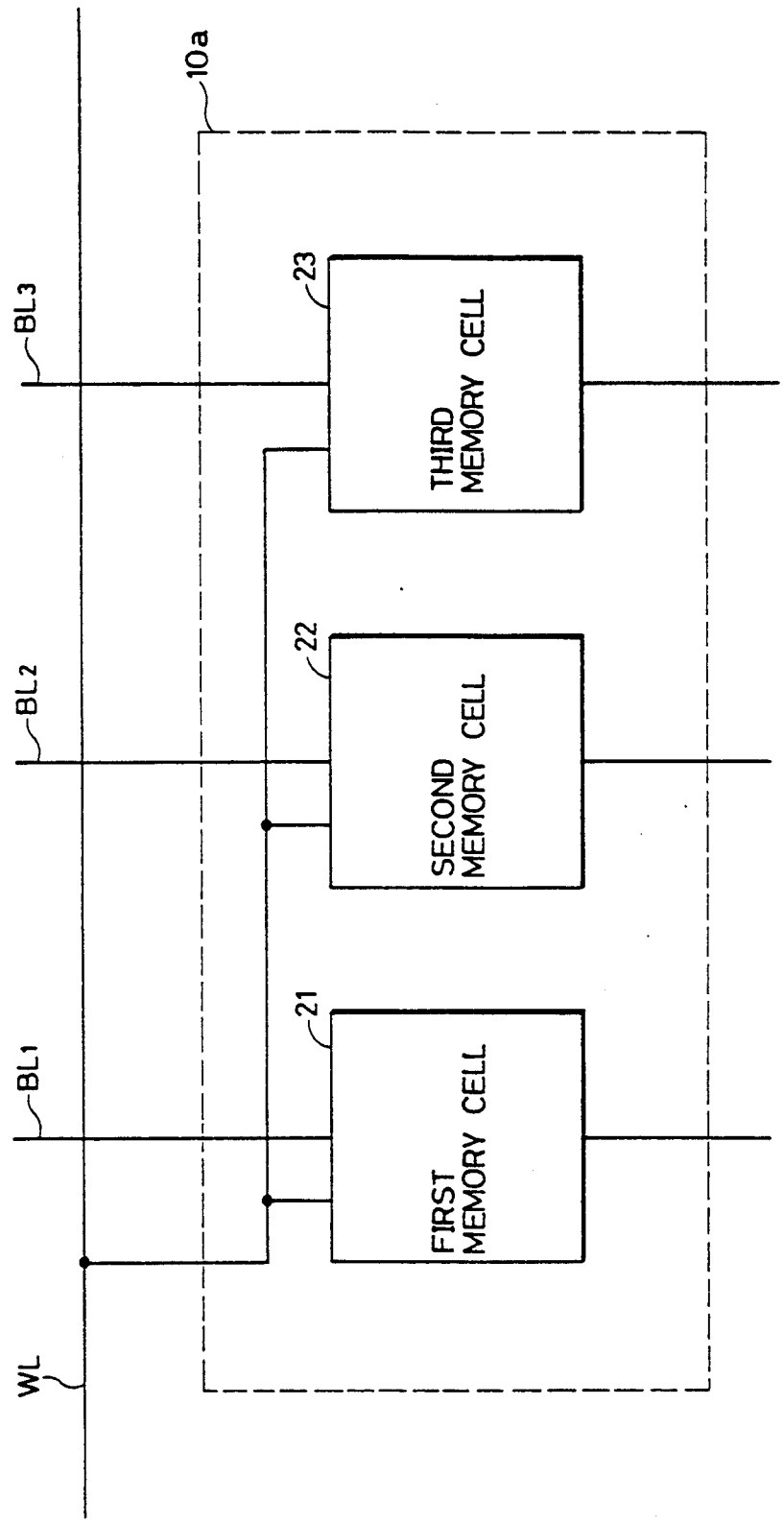
FIG. 8 is a block diagram showing configuration of a memory circuit included in the semiconductor memory device of the embodiment in FIG. 7.

The configuration of each memory circuit 10a is shown in FIG. 8. Memory circuit 10a includes a first memory cell 21, a second memory cell 22 and a third memory cell 23. First memory cell 21 is connected to a corresponding first bit line BL1, second memory cell 22 is connected to a second bit line BL2, and third memory cell 23 is connected to a corresponding third bit line BL3. Control terminals of first memory cell 21, second memory cell 22 and third memory cell 23 are connected to a corresponding word line WL. Each of first, second and third memory cells 21, 22, 23 stores a bit of data.

Each of bits of binary number data is applied to first bit line BL1. A sign bit at each digit of redundant binary number data is applied to second bit line BL2. A data bit at each digit of redundant binary number data is applied to third bit line BL3. First memory cell 21 stores one bit of binary number data, second memory cell 22 stores a digit of sign bit of redundant binary number data, and third memory cell 23 stores a digit of data bit of redundant binary number data.

Figure 9:
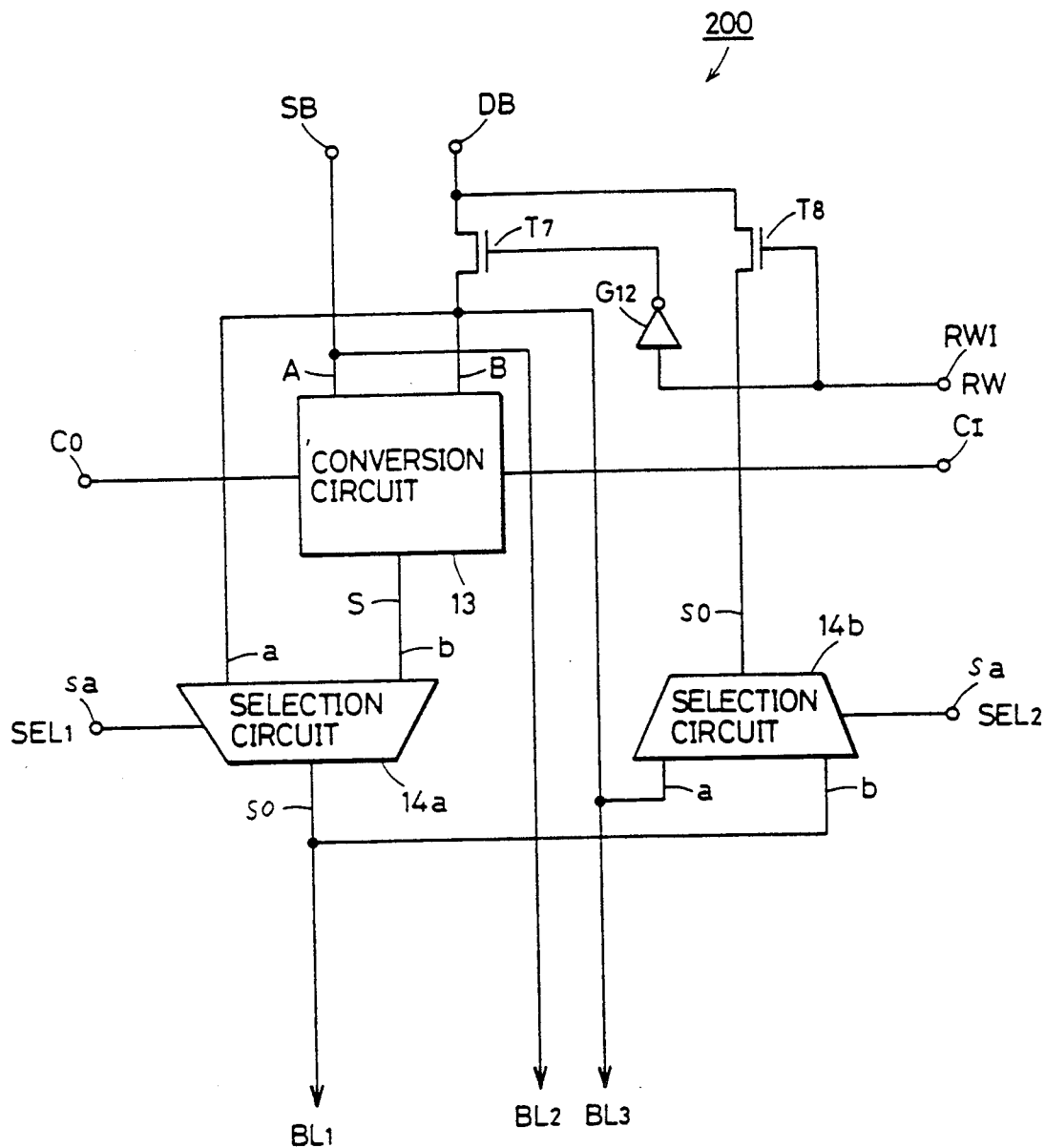
FIG. 9 is a diagram indicating configuration of a reading/writing-conversion circuit.
Figure 12:
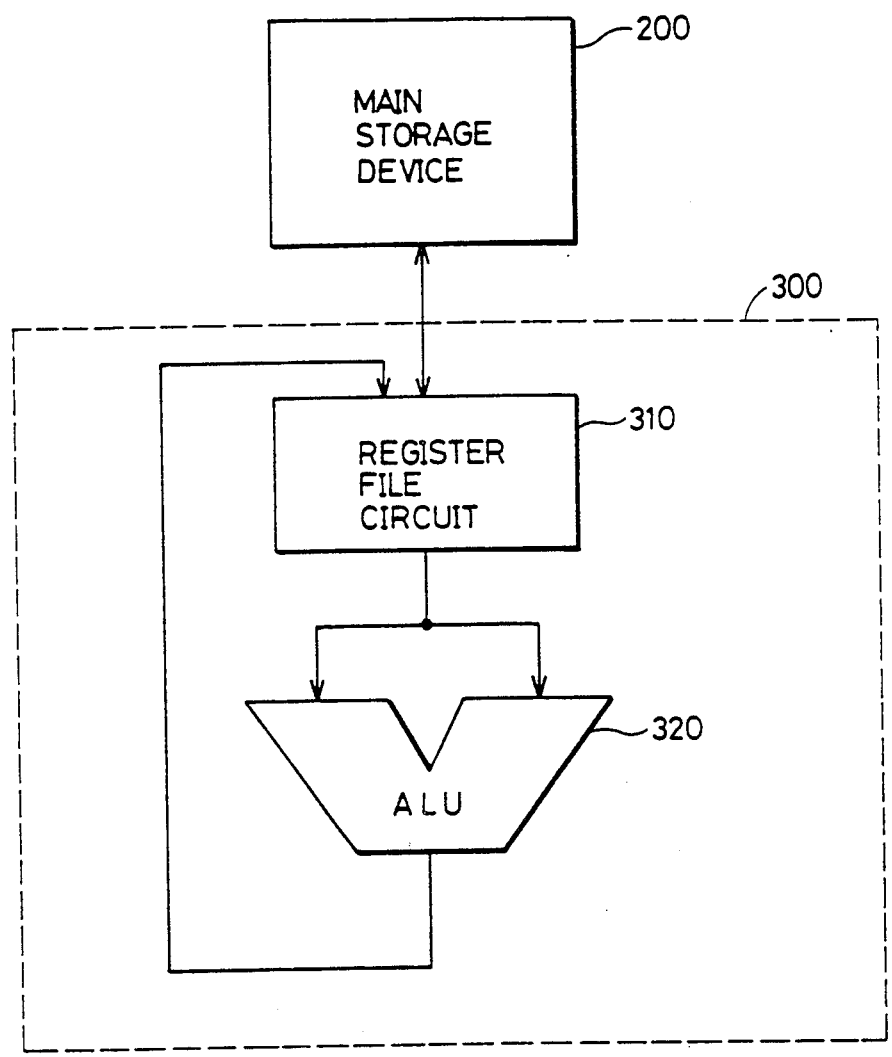
FIG. 12 is a block diagram showing configuration of an execution unit of a conventional microprocessor.

The configuration of reading/writing-conversion circuit 20a is shown in FIG. 9. A circuit portion 200 corresponding to 1 bit only is shown in FIG. 9. Actually, reading/writing-conversion circuit 20a includes a plurality of circuit portions 200 having the configuration shown in FIG. 9 corresponding to a plurality of bits.

The circuit portion 200 includes a conversion circuit 13, selection circuits 14a and 14b, N channel MOS transistors T7 and T8 and an inverter G12. An input/output terminal DB receives a data bit and an input/output terminal SB receives a sign bit. An input terminal RWI receives a read/write signal RW. A carry input terminal CI receives a carry signal CR from a circuit portion corresponding to a lower order bit. A carry signal CR outputted from carry output terminal CO is applied to a circuit portion corresponding to a higher order bit. A select terminal sa of selection circuit 14a receives a selection signal SEL1 for writing. A select terminal sa of selection circuit 14b receives a selection signal SEL2 for reading. An output terminal so of selection circuit 14a and an input terminal b of selection circuit 14b are connected to bit line BL1. An input terminal A of conversion circuit 13 is connected to bit line BL2. An input terminal B of conversion circuit 13 is connected to bit line BL3.

When a read/write signal RW is "1", a reading operation is performed. At this time, transistor T7 turns off and transistor T8 turns on. Selection circuit 14b, in response to selection signal SEL2, selects one of a bit of binary number data read to bit line BL1 and a data bit of redundant binary number data read to bit line BL3 and provides it to input/output terminal DB. A sign bit read to bit line BL2 is applied to input/output terminal SB.

When the read/write signal RW is "0", a writing operation is performed. At this time, transistor T7 turns on and transistor T8 turns off. A bit of binary number on and transistor T8 turns off. A bit of binary number data applied to input/output terminal DB or a data bit of redundant binary number data is applied to bit line BL3, input terminal B of conversion circuit 13 and input terminal a of selection circuit 14a. A sign bit of redundant binary number data applied to input/output terminal SB is applied to bit line BL2 and input terminal A of conversion circuit 13. Selection circuit 14a, in response to selection signal SEL1, selects one of a bit of binary number data or a data bit of redundant binary number data applied to input terminal a and an output signal of conversion circuit 13 applied to input terminal b and provides it to bit line BL1.

Next, referring to FIGS. 7 and 8, operation of semiconductor memory device 1a of the present embodiment will be described.

When writing redundant binary number data, the writing operation of redundant binary number data is selected with a reading/writing signal RW and a selection signal SEL1. Thus, reading/writing-conversion circuit 20a converts externally applied redundant binary number data D into binary number data. Furthermore, reading/writing-conversion circuit 20a applies respective bits of converted binary number data to respective first bit lines BL1, applies respective digits of sign bits of the externally applied redundant binary number data to the respective second bit lines BL2, and respective digits of data bits of the externally applied redundant binary number data to the respective third bit lines BL3.

On the other hand, decoder-control circuit 30 selects one of the plurality of word lines WL in response to an address signal AD externally applied. Thus, first, second and third memory cells 21, 22, 23 inside respective memory cells 10a connected to the selected word line WL attain active states. As a result, binary number data on the plurality of first bit lines BL1 are written in first memory cells 21 in memory circuits 10a at the row. Also, sign bits of redundant binary number data on the plurality of second bit lines BL2 are written into second memory cells 22 in memory circuits 10a at the single row, and data bits of redundant binary number data on the plurality of third bit lines BL3 are written into third memory cells 23 in memory circuits 10a of one row.

When writing binary number data, the writing operation of binary number data is selected with an externally applied reading/writing signal RW and a selection signal SEL1. In this case, reading/writing-conversion circuit 20a applies each bit of externally applied binary number data to each first bit line BL1 and each third bit line BL3 and also applies "0" to each second bit line BL2.

On the other hand, decoder-control circuit 30 selects one of the plurality of word lines WL in response to an externally applied address signal AD. Thus, first, second and third memory cells 21, 22, 23 in the respective memory cells 10a connected to the selected word line WL attain active states. As a result, binary number data on a plurality of first and third bit lines BL1, BL3 are written into first memory cells 21 and third memory cell 23 in memory circuits 10a at one row, and "0" is written into second memory cells 22.

When reading redundant binary number data, the reading operation of redundant binary number data is selected with a reading/writing signal RW and a selection signal SEL1. Also, in this case, one word line WL is selected by decoder-control circuit 30 and first, second and third memory cells 21, 22, 23 in the respective memory circuits 10a connected to the selected word line WL attain active state. As a result, each bit of binary data stored in each of first memory cells 21 is read to corresponding first bit line BL1. Also, a sign bit at each digit of redundant binary number data stored in each of second memory cells 22 is read to a corresponding second bit line BL2 and a data bit at each digit of redundant binary number data stored in each of third memory cells 23 is read to a corresponding third bit line BL3. In this case, reading/writing-conversion circuit 20a externally provides as an output redundant binary number data on the plurality of second and third bit lines BL2, BL3.

When reading binary number data, the reading operation of binary number data is selected with a reading/writing signal RW and a selection signal SEL1. In this case, in the same way as that described above, each bit of binary number data is read to each first bit line BL1, a sign bit at each digit of redundant binary number data is read to each second bit line BL2, and a data bit of each digit of redundant binary number data is read to each third bit line BL3. In this case, reading/writing-conversion circuit 20a externally provides as an output the binary number data on the plurality of first bit lines BL1.

In this embodiment, each memory circuit 10a does not include a conversion circuit, but a single conversion circuit only is provided in semiconductor memory device 1a, so that its circuit scale is small.

In this embodiment, even if any of binary number data and redundant binary number data is written, that data is written in both forms of binary number data and redundant binary number data. Accordingly, use of semiconductor memory device 1a in this embodiment as register file circuit 130 in microprocessor 100 shown in FIG. 6 enables operation processings at high speed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
   at least one storing means having a memory cell for storing redundant binary number data, converting means for converting the redundant binary number data stored in said memory cell into binary number data, and selecting means responsive to a selection signal for selecting one of the redundant binary number data stored in said memory cell and the binary number data converted by said converting means;
   writing means for writing binary number data or redundant binary number data into said memory cell of said storing means; and
   reading means for reading the data selected by said selecting means.

2. The semiconductor memory device according to claim 1, wherein said memory cell comprises:
   a first memory cell for storing one bit of binary number data or a data bit of redundant binary number data, and
   a second memory cell for storing a sign bit of redundant binary number data.

3. The semiconductor memory device according to claim 2, wherein said writing means writes a bit of binary number data into said first memory cell of said storing means and writes logical "0" into said second memory cell of said storing means when writing binary number data.

4. A semiconductor memory device, comprising:
   a plurality of storing means arranged in a plurality of rows and columns, said plurality of storing means each including a memory cell storing redundant binary number data, converting means for converting redundant binary number data stored in said memory cell into binary number data, and data selecting means responsive to a selection signal for selecting one of the redundant binary number data stored in said memory cell and the binary number data converted by said converting means;
   row selecting means for selecting one of said plurality of rows;
   writing means for writing binary number data or redundant binary number data into said memory cell of storing means at said selected row when writing data; and
   reading means for reading the data selected by said data selecting means from said memory cell at the storing means at said selected row when reading data.

5. The semiconductor memory device according to claim 4, wherein said memory cell comprises;
   a first memory cell for storing a bit of binary number data or a data bit of redundant binary number data, and
   a second memory cell for storing a sign bit of redundant binary number data.

6. The semiconductor memory device according to claim 5, wherein said writing means writes a bit of a binary number into said first memory cell of said selected storing means and writes logical "0" into said second memory cell of said selected storing means when writing binary number data.

7. The semiconductor memory device according to claim 5, further comprising:
   a plurality of first bit lines provided corresponding to said plurality of columns, each being connected to a first memory cell in storing means at a corresponding column;
   a plurality of second bit lines provided corresponding to said plurality of columns, each being connected to a second memory cell in storing means at a corresponding column; and
   a plurality of word lines provided corresponding to said plurality of rows, each being connected to a first memory cell and a second memory cell in storing means at a corresponding row;
   said row selecting means selecting one of said plurality of word lines in response to an address signal externally applied; and
   whereby data is written into first and second memory cells in the storing means connected to said selected word line through said plurality of first and second bit lines by said writing means when writing data, and when reading data, selected data in storing means connected to said selected word line is read by said reading means through said plurality of first and/or second bit lines.

8. The semiconductor memory device according to claim 7, wherein each of said data selecting means of said plurality of storing means is activated when a corresponding word line is selected when reading data, and applies a bit of binary number data converted by a corresponding converting means or a data bit of redundant binary number data stored in a corresponding first memory cell in response to an externally applied selection signal to a corresponding first bit line.

9. The semiconductor memory device according to claim 4, wherein said writing means operates in response to an externally applied writing specifying signal and said reading means operates in response to an externally applied reading specifying signal.

10. A semiconductor memory device, comprising:
    storing means having first memory circuit means for storing binary number data and second memory circuit means for storing redundant binary number data;
    converting means for converting externally applied redundant binary number data into binary number data;
    writing means for writing said externally applied redundant binary number data and the binary number data converted by said converting means into said first and second memory circuit means of said storing means, respectively, and;

reading means for selectively reading the binary number data stored in said first memory circuit means of said storing means or the redundant binary number data stored in said second memory circuit means of said storing means.

11. The semiconductor memory device according to claim 10, wherein
said first memory circuit means includes a first memory cell for storing a bit of binary number data, and
said second memory circuit means includes a second memory cell for storing a data bit of redundant binary number data and a third memory cell for storing a sign bit of redundant binary number data.

12. A semiconductor memory device, comprising:
a plurality of storing means arranged in a plurality of rows and columns, each of said plurality of storing means including first memory circuit means for storing binary number data and second memory circuit means for storing redundant binary number data;
converting means for converting externally applied redundant binary number data into binary number data;
row selecting means for selecting one of said plurality of rows;
writing means for writing said externally applied redundant binary number data and the binary number data converted by said converting means into said first and second memory circuit means of the storing means at said selected row when writing data, respectively; and
reading means for selecting reading binary number data stored in said first memory circuit means of the storing mean sat said selected row or redundant binary number data stored in said second memory circuit means of said selected storing means.

13. The semiconductor memory device according to claim 12, wherein
said first memory circuit means includes a first memory cell for storing a bit of binary number data, and
said second memory circuit means includes a second memory cell for storing a data bit of redundant binary number data and a third memory cell for storing a sign bit of redundant binary number data.

14. The semiconductor memory device according to claim 13, further comprising:
a plurality of first bit lines provided corresponding to said plurality of columns, each being connected to a first memory cell in storage means at a corresponding column;
a plurality of second bit lines provided corresponding to said plurality of columns, each being connected to a second memory cell in storing means at a corresponding column;
a plurality of third bit lines provided corresponding to said plurality of columns, each being connected to a third memory cell in storing means at a corresponding column;
a plurality of word lines provided corresponding to said plurality of rows, each being connected to first, second and third memory cells in storing means at a corresponding row;
said row selecting means selecting one of said plurality of word lines in response to an externally applied address signal; and
wherein, in data writing, binary number data is written into the first memory cell in the storing means connected to said selected word line by said writing means through said plurality of first bit lines and redundant binary number data is written into the second and third memory cells in the storing means connected to said selected word line by said writing means through said plurality of second and third bit lines, and in data reading, binary data stored in the first memory cell in the storing means connected to said selected word line or redundant binary number data stored in the second and third memory cells in the storing means connected to said selected word line is read by said reading means through said plurality of first bit lines or said plurality of second and third bit lines.

15. The semiconductor memory device according to claim 14, wherein said reading means is responsive to an externally applied selecting signal for selecting one of binary number data on said plurality of first bit lines and redundant binary number data on said plurality of second and third bit lines to read the selected data.

16. The semiconductor memory device according to claim 12, wherein said writing means operates in response to an externally applied writing specifying signal and said reading means operates in response to an externally applied reading specifying signal.

17. A semiconductor integrated circuit device comprising:
first operation processing means for executing an operation process using binary number data;
second operation processing means for executing an operation process using redundant binary number data;
storing circuit means for storing binary number data and redundant binary number data;
a data bus connected to said first and second operation processing means and said storing circuit means; and
input/output interface means for inputting/outputting data on said data bus; wherein
said storing circuit means comprises,
a plurality of storing means including a memory cell for storing redundant binary number data, converting means for converting the redundant binary number data stored in said memory cell into binary number data, and data selecting means responsive to a selection signal for selecting one of the redundant binary number data stored in said memory cell and the binary number data converted by said converting means;
memory cell selecting means for selecting one of said plurality of storing means;
writing means for writing the binary number data or the redundant binary number data on said data bus into said memory cell of said selected storing means; and
reading means for reading the data selected by said data selecting means of said selected storing means onto said data bus.

18. The semiconductor integrated circuit device, according to claim 17, wherein
said data bus includes a first data bus connected to said first and second operation processing means and said storing circuit means; and
a second data bus connected to said second-operation processing means and said storing circuit means.

19. A semiconductor integrated circuit device, comprising:
first operation processing means for performing an operation process employing binary number data;

second operation processing means for performing an operating process using redundant binary number data;

storing circuit means for storing binary number data and redundant binary number data;

a first data bus connected to said first and second operation processing means and said storing circuit means;

a second data bus connected to said second operation processing means and said string circuit means; and input/output interface means for inputting/outputting data on said first data bus;

wherein said storing circuit means comprises:

a plurality of storing means including a first memory cell for storing binary number data and a second memory cell for storing redundant binary number data, converting means for converting the redundant binary number data applied from said second data bus into binary number data, selecting means for selecting one of said plurality of storing means, writing means for writing the redundant binary number data applied from said second data bus and the binary number data converted by said converting means into said first and second memory cells of said selected storing means, respectively, and reading means for selectively reading the binary number data stored in said first memory cell of said selected storing means or the redundant binary number data stored in said second memory cell of said selected storing means onto said first or second data bus.

20. A method of operating a semiconductor memory device including a memory cell for storing redundant binary number data or binary number data, comprising the steps of:

writing a first type of binary number data into said memory cell;

converting the redundant binary number data stored in said memory cell into the binary number data;

selecting one of the redundant binary number data stored in said memory cell and said converted binary number data responsive to a selection signal; and selectively reading said selected data.

21. A method of operating a semiconductor memory device including a first memory cell for storing redundant binary number data and a second memory cell for storing binary number data, comprising the steps of:

converting externally applied redundant binary number data into binary number data;

writing said externally applied redundant binary number data and said converted binary number data into said first and second memory cells, respectively; and selectively reading the redundant binary number data stored in said first memory cell and the binary number data stored in said second memory cell responsive to a selection signal.

22. A semiconductor memory device, comprising:

a plurality of word lines corresponding to a plurality of rows;

a plurality of bit lines corresponding to a plurality of columns, said plurality of bit lines crossing said word lines;

a plurality of storing means at crossover points of said word lines and bit lines;

each said storing means comprising (a) first and second cells for storing respectively sign and data bits representing redundant data, said second cell alternatively storing a data bit for normal data;

(b) means receiving outputs of said first and second cells for converting said redundant data to normal data; and (c) means responsive to a selection signal for selecting one of said redundant data and normal data.

23. The device of claim 22, wherein a pair of bit lines is associated with each said storing mean, and wherein said bit lines carry respectively said sign and data bits for redundant data.

24. The device of claim 23, wherein one of said bit lines carries a normal data bit for normal data.

* * * * *